(12) United States Patent  (10) Patent No.: US 7,508,190 B2
Kagan et al.  (45) Date of Patent: Mar. 24, 2009

(54) TEST PULSES FOR ENABLING REVENUE TESTABLE PANEL METERS

(75) Inventors: Erran Kagan, Great Neck, NY (US); Tibor Banhegyesi, Baldwin, NY (US)

(73) Assignee: Electro Industries/Gauge Tech., Westbury, NY (US)

(*) Notice: Subject to any disclaimer, the term of this patent is extended or adjusted under 35 U.S.C. 154(b) by 0 days.

(21) Appl. No.: 11/317,227

(22) Filed: Dec. 22, 2005

(65) Prior Publication Data

US 2006/0170409 A1  Aug. 3, 2006

Related U.S. Application Data

(63) Continuation-in-part of application No. 10/969,713, filed on Oct. 20, 2004, now abandoned.

(51) Int. Cl.
*G01R 7/00* (2006.01)
(52) U.S. Cl. ............................. 324/142; 324/74; 702/60
(58) Field of Classification Search ................ 324/74, 324/134, 142, 76.11; 702/61, 60; 361/659
See application file for complete search history.

(56) References Cited

U.S. PATENT DOCUMENTS

| | | | |
|---|---|---|---|
| 2,900,605 A | 8/1959 | Squires et al. |
| 2,992,365 A | 7/1961 | Brill |
| 3,084,863 A | 4/1963 | Du Vall |
| 3,205,439 A | 9/1965 | Sangi et al. |
| 3,458,810 A | 7/1969 | Wald |
| 4,066,960 A | 1/1978 | Milkovic |

(Continued)

FOREIGN PATENT DOCUMENTS

WO  WO 98/54583  12/1998

(Continued)

OTHER PUBLICATIONS

Manual, "3300 ACM, Economical Digital Power Meter/Transducer - Installation and Operation Manual, Power Measurement, Ltd.", 1999, pp. 79.

(Continued)

*Primary Examiner*—Ha Tran T Nguyen
*Assistant Examiner*—Arleen M Vazquez
(74) *Attorney, Agent, or Firm*—Michael J. Porco; Gerald E. Hespos; Anthony J. Casella

(57) ABSTRACT

A panel meter including an energy test pulse device that enables the panel meter to be used for revenue applications and eliminates the need for two separate meters, one for panel indication, and the other for energy and revenue applications. The electrical panel meter including at least one sensor configured for measuring an electrical parameter; at least one analog-to-digital converter coupled to the at least one sensor for converting the measured electrical parameter to a digital signal; a display for continuously displaying at least one electrical parameter; a processor configured to receive the digital signal and calculate an amount of energy consumed; and a test pulse circuit configured to receive the calculated amount and generate a plurality of pulses equal to the calculated amount, wherein each of the plurality of pulses is equal to a predetermined amount of energy.

11 Claims, 4 Drawing Sheets

U.S. PATENT DOCUMENTS

| | | | |
|---|---|---|---|
| 4,077,061 A | 2/1978 | Johnston et al. | |
| 4,182,983 A | 1/1980 | Heinrich et al. | |
| 4,240,149 A | 12/1980 | Fletcher et al. | |
| 4,283,772 A | 8/1981 | Johnston | |
| 4,345,311 A | 8/1982 | Fielden | |
| 4,360,879 A | 11/1982 | Cameron | |
| 4,437,059 A | 3/1984 | Hauptmann | |
| 4,442,492 A | 4/1984 | Karlsson et al. | |
| 4,463,311 A | 7/1984 | Kobayashi | |
| 4,486,707 A | 12/1984 | Randall et al. | |
| 4,608,533 A | 8/1986 | Starkie | |
| 4,630,229 A * | 12/1986 | D'Hondt | 708/405 |
| 4,658,829 A * | 4/1987 | Wallace | 600/488 |
| 4,713,608 A | 12/1987 | Catiller et al. | |
| 4,713,609 A | 12/1987 | Losapio et al. | |
| 4,742,296 A | 5/1988 | Petr et al. | |
| 4,761,606 A * | 8/1988 | Germer et al. | 324/142 |
| 4,799,008 A | 1/1989 | Kannari | |
| 4,839,819 A | 6/1989 | Begin et al. | |
| 4,843,311 A | 6/1989 | Rozman et al. | |
| 4,902,965 A | 2/1990 | Bodrug et al. | |
| 4,933,633 A | 6/1990 | Allgood | |
| 4,949,029 A | 8/1990 | Cooper et al. | |
| 4,958,294 A | 9/1990 | Herscher et al. | |
| 4,989,155 A | 1/1991 | Begin et al. | |
| 4,999,572 A | 3/1991 | Bickford et al. | |
| 5,014,229 A | 5/1991 | Mofachern | |
| 5,017,860 A | 5/1991 | Germer et al. | |
| 5,059,896 A * | 10/1991 | Germer et al. | 324/142 |
| 5,079,715 A | 1/1992 | Venkataraman et al. | |
| 5,122,735 A | 6/1992 | Porter et al. | |
| 5,132,609 A | 7/1992 | Nguyen | |
| 5,132,610 A | 7/1992 | Ying-Chang | |
| 5,170,115 A | 12/1992 | Kashiwabara et al. | |
| 5,212,441 A | 5/1993 | McEachern et al. | |
| 5,229,713 A | 7/1993 | Bullock et al. | |
| 5,243,536 A | 9/1993 | Bradford | |
| 5,245,275 A | 9/1993 | Germer et al. | |
| 5,248,935 A | 9/1993 | Sakoyama et al. | |
| 5,248,967 A | 9/1993 | Daneshfar | |
| 5,258,704 A | 11/1993 | Germer et al. | |
| 5,265,099 A * | 11/1993 | Feinstein | 714/718 |
| 5,289,115 A | 2/1994 | Germer et al. | |
| 5,298,854 A | 3/1994 | McEachern et al. | |
| 5,298,855 A | 3/1994 | McEachern et al. | |
| 5,298,856 A | 3/1994 | McEachern et al. | |
| 5,301,121 A | 4/1994 | Garverick et al. | |
| 5,302,890 A | 4/1994 | McEachern et al. | |
| 5,343,143 A | 8/1994 | Voisine et al. | |
| 5,391,983 A | 2/1995 | Lusignan et al. | |
| 5,406,495 A | 4/1995 | Hill | |
| 5,442,279 A | 8/1995 | Kitayoshi et al. | |
| 5,458,137 A * | 10/1995 | Axe et al. | 128/204.23 |
| 5,459,459 A | 10/1995 | Lee, Jr. | |
| 5,495,167 A | 2/1996 | Cotroneo | 324/74 |
| 5,528,507 A | 6/1996 | McNamara et al. | |
| 5,537,029 A | 7/1996 | Hemminger et al. | 324/142 |
| 5,548,527 A | 8/1996 | Hemminger et al. | |
| 5,555,508 A | 9/1996 | Munday et al. | |
| 5,619,142 A | 4/1997 | Schweer et al. | |
| 5,627,759 A | 5/1997 | Bearden et al. | |
| 5,642,300 A | 6/1997 | Gubisch et al. | |
| 5,644,222 A * | 7/1997 | Dohmstreich et al. | 324/74 |
| 5,650,936 A | 7/1997 | Loucks et al. | |
| 5,706,214 A | 1/1998 | Putt et al. | |
| 5,715,390 A * | 2/1998 | Hoffman et al. | 726/20 |
| 5,734,571 A | 3/1998 | Pilz et al. | |
| 5,736,847 A | 4/1998 | Van Doorn et al. | |
| 5,737,231 A | 4/1998 | Pyle et al. | |
| 5,828,576 A | 10/1998 | Loucks et al. | |
| 5,862,391 A | 1/1999 | Salas et al. | |
| 5,890,097 A * | 3/1999 | Cox | 702/67 |
| 5,897,607 A | 4/1999 | Jenney et al. | |
| 5,933,029 A | 8/1999 | Kuroda et al. | |
| 5,963,734 A | 10/1999 | Ackerman et al. | |
| 5,994,892 A | 11/1999 | Turino et al. | |
| 5,995,911 A | 11/1999 | Hart | |
| 6,023,160 A | 2/2000 | Coburn | |
| 6,058,354 A * | 5/2000 | Adame et al. | 702/60 |
| 6,064,192 A | 5/2000 | Redmyer | |
| 6,185,508 B1 | 2/2001 | Van Doorn et al. | |
| 6,262,672 B1 | 7/2001 | Brooksby et al. | |
| 6,374,084 B1 | 4/2002 | Fok | |
| 6,401,054 B1 | 6/2002 | Andersen | |
| 6,429,637 B1 | 8/2002 | Gandhi | |
| 6,522,982 B1 * | 2/2003 | Pastorello et al. | 702/61 |
| 6,590,380 B2 | 7/2003 | Edel | |
| 6,657,424 B1 * | 12/2003 | Voisine et al. | 324/76.11 |
| 6,671,635 B1 | 12/2003 | Forth et al. | |
| 6,694,270 B2 | 2/2004 | Hart | |
| 6,714,881 B2 | 3/2004 | Carlson et al. | |
| 6,735,535 B1 | 5/2004 | Kagan et al. | |
| 6,759,837 B2 | 7/2004 | Gandhi | |
| 6,792,364 B2 * | 9/2004 | Jonker et al. | 702/61 |
| 6,798,191 B1 * | 9/2004 | Macfarlane et al. | 324/157 |
| 6,876,927 B1 * | 4/2005 | Chatelain et al. | 702/1 |
| 6,906,507 B2 | 6/2005 | Briese et al. | 324/142 |
| 6,954,061 B2 * | 10/2005 | Hemminger et al. | 324/142 |
| 6,957,158 B1 * | 10/2005 | Hancock et al. | 702/61 |
| 6,988,043 B1 | 1/2006 | Randall | |
| 7,010,438 B2 * | 3/2006 | Hancock et al. | 702/60 |
| 7,174,261 B2 | 2/2007 | Gunn et al. | |
| 7,191,076 B2 | 3/2007 | Huber et al. | |
| 2003/0014200 A1 | 1/2003 | Jonker et al. | 702/60 |
| 2003/0178985 A1 | 9/2003 | Briese et al. | |
| 2004/0183522 A1 | 9/2004 | Gunn et al. | |
| 2004/0249485 A1 | 12/2004 | Bondarev et al. | 700/71 |
| 2005/0071106 A1 | 3/2005 | Huber et al. | |
| 2005/0288876 A1 | 12/2005 | Doig et al. | |
| 2006/0095219 A1 | 5/2006 | Bruno | |
| 2006/0120028 A1 * | 6/2006 | Kagan et al. | 361/659 |

FOREIGN PATENT DOCUMENTS

WO      WO 01/55733      8/2001

OTHER PUBLICATIONS

Brochure, Sentinel TM Electronic "Multimeasurement Meter," Schlumberger, Mar. 2001, 4 pages.
7700 Ion 3-Phase Power Meter, Analyzer and Controller, pp. 1-8, Nov. 30, 2000.
6200 ION, Installation & Basic Setup Instructions, (c)Power Measurement Ltd., Revision Date Apr. 25, 2001, 50 pages.
ION(R) Technology, Meter Shop User's Guide, (c)Power Measurement Ltd., Revision Date May 10, 2001, 48 pages.
User' Installation & Operation and User's Programming Manual, The Futura Series, Electro Industries, pp. 1-64, (c)1995.
Nexus 1250 Installation and Operation Manual Revision 1.20, Electro Industries/Guage Tech, 50 pages, Nov. 8, 2000.
8400 ION/8500 ION Instruction Leaflet, Power Measurement, pp. 1-8, Oct. 1999.
Nexus 1250, Precision Power Meter & Data Acquisition Node, Accumeasure(r) Technology, Electro Industries/Gauge Tech, specification, 16 pages, Nov. 1999.
3720 ACM, 3-hase Power Instruction Package, Power Measurement, specification, 8 pages, revision date Dec. 16, 1998.
3720 ACM, Installation & Operation Manual, Power Measurement, 67 pages, revision date Apr. 4, 2000.
ION Technology, 7500 ION High Visibility 3-Phase Energy & Power Quality Meter, Power Measurement, specification, pp. 1-8, revision date Mar. 21, 2000.
ION Technology 7700 ION 3-Phase Power Meter, Analyzer and Controller, Power Measurement, specification, pp. 1-10, revision date Dec. 8, 1998.

ION Technology 7700 ION Installation & Operation Manual, Power Measurement, revision date Nov. 20, 1996.

8500 ION Technical Documentation, 8500 ION and 8500 ION-PQ Advanced Intelligent Billing Meters, specification, Power Measurement, revision date Apr. 15, 1999.

ION Technology 8500 ION Advanced Socket-Mount Meter, specification, Power Measurement, pp. 1-12, revision date Dec. 3, 1999.

ION Technology 7500 ION 7600 ION High Visibility Energy and Power Quality Compliance Meters, specification, Power Measurement, pp. 1-8, revision date Nov. 30, 2000.

Performance Power Meter & Data Acquisition Node, Electro Industries/Gauge Tech, Nexus 1250 specification, 8 pages, Dec. 14, 2000.

Nagura et al., "Correction method for a single chip power meter", May 10-12, 1994, IEEE, 1994 IEEE Instrumentation and Measurement Technology Conference, 1994. ITMC/94.

http://www.landisgyr.us/Landis_Gyr/Meters/2510_socket_meter.asp, Apr. 18, 2005, 25 pages.

7500 ION Installation and Basic Setup Instructions, pp. 1-37 revision dates Feb. 17, 2000.

Addendum to Users Guide Addendum v206, pp. 1-33, date Dec. 20, 2000.

7500 ION Users Guide, Oct. 15, 1999.

7500 ION 7600 ION High Visibility Energy and Power Quality Compliance Meters, pp. 1-8 revision date Aug. 31, 2000.

* cited by examiner

TEST PULSES FOR ENABLING REVENUE TESTABLE PANEL METERS

CROSS REFERENCE TO RELATED APPLICATIONS

The present application is a continuation-in-part application of U.S. application Ser. No. 10/969,713, filed Oct. 20, 2004 entitled "TEST PULSES FOR ENABLING REVENUE TESTABLE PANEL METERS", the contents of which are hereby incorporated by reference.

BACKGROUND OF THE INVENTION

1. Field of the Invention

The present invention relates generally to electrical panel meters, and more specifically, to a system and method for utilizing test pulses in electrical panel meters to enable their use for revenue metering.

2. Discussion of the Related Prior Art

Electric utility companies use revenue meters to track electric usage by customers. These meters track the amount of power consumed at a particular location. These locations range from commercial businesses to residential homes. The electric utility companies use the revenue meter to charge its customers for their power consumption, i.e., revenue metering. Typically, the revenue meter connects between utility power lines supplying electricity and a usage point, namely a residence or commercial place of business.

Traditionally, panel mounted or panel meters were utilized only for a visual indication of instantaneous readings on an electrical switchboard panel. In the past, these panel meters were exclusively analog, and were utilized for measuring the amount of voltage, current, wattage etc., supplied to consumers through the utility lines. As metering technology progressed, the panel meters became multifunction, and have the ability to measure energy as well as instantaneous measurements.

However, even though the panel meters had the ability to measure energy, the panel meters did not have the ability to be tested and verified for accuracy using traditional Utility energy based testing methods. Furthermore, since these types of meters are used generally for indication, the hardware design for panel meters was limited to a low accuracy standard, e.g., 1%, making energy test pulses futile. Therefore, conventional panel meters do not have the capability to be used for revenue billing measurements.

Traditionally, revenue meters used mechanical or analog means to track the amount of consumed power. The inductive spinning disk power meter is still commonly used. The spinning disk drives mechanical counters that track the power consumption information. Newer to the market are electronic power meters, which have replaced the older mechanical meters. Electronic revenue meters utilize digital sampling of the voltage and current waveforms to generate power consumption information. In addition to monitoring power consumption, electronic revenue meters can also monitor and calculate power quality, e.g., voltage, current, real power, reactive power, apparent power, etc. These power quality measurements and calculations are displayed on an output display device on the meter.

The traditional method for testing the revenue meters is to take an infrared pulse supplied by the mechanical energy meter, which pulses proportionally to the energy accumulated, e.g., one revolution of the inductive spinning disk equals one pulse. The standard revolution value is 1.8 watt-hours per pulse, but this value is generally adjustable. The pulses are then counted and compared to pulses generated by a standard energy reference. If the accuracy of the taken infrared pulses is within the percentage required by the industry standards, then the energy meter would be determined to be in good standing and put into service. Otherwise, the meter would be re-calibrated and tested again or not used.

The veracity of panel measuring devices could not be determined in the field through the use of traditional methods and equipment. Since utility testing equipment relies on energy pulse accumulation of which are not available with indication panel instrumentation. Therefore, these meters would not be used for billing purposes as the supplied data can potentially be erroneous.

SUMMARY OF THE INVENTION

Therefore, the present invention has been designed to substantially solve at least the above problems and/or disadvantages and to provide at least the advantages below.

Accordingly, an object of the present invention is to provide an electrical panel metering device capable of performing multiple metering functions including an energy test device for testing a veracity of an energy measurement of the electrical panel metering device.

According to another object of the present invention, a method for testing a veracity of an energy measurement of an electrical panel metering device is provided. The method includes the step of proving an energy test pulse to verify the energy measurement of the electrical panel metering device.

According to one aspect of the present disclosure, an electrical panel metering device including a housing is provided. The panel metering device includes at least one sensor configured for measuring an electrical parameter; at least one analog-to-digital converter coupled to the at least one sensor for converting the measured electrical parameter to a digital signal; a display for continuously displaying at least one electrical parameter; a processor configured to receive the digital signal and calculate an amount of energy consumed; and a test pulse circuit configured to receive the calculated amount and generate a plurality of pulses equal to the calculated amount, wherein each of the plurality of pulses is equal to a predetermined amount of energy. The at least one analog-to-digital converter has 24 bit resolution and has a sampling rate of 400 samples per cycle.

In another aspect of the present disclosure, the test pulse circuit includes an LED disposed on a face of the housing to generate infrared pulses.

In a further aspect, the test pulse circuit further includes a divider for receiving the calculated amount from the processor, generating the plurality of pulses and transmitting the pulses to the LED.

In another aspect of the present disclosure, the at least one analog-to-digital converter, the processor, and the test pulse circuit are disposed on a single integrated circuit.

In various embodiments, the display is configured to continuously and simultaneously display at least three electrical parameters. The display may further include a % load bar display.

According to another aspect, an electrical panel metering device including a housing having a front face includes three current sensors configured for measuring current on each of three phases of an electrical distribution system; three voltage sensors configured for measuring voltage on each of three phases of an electrical distribution system; six analog-to-digital converters for converting the measured electrical parameters to digital signals, each analog-to-digital converter coupled to one of the three current sensors and three voltage sensors; a display disposed on the front face for continuously displaying at least three electrical parameters; a processor configured to receive the digital signals and calculate an amount of energy consumed; a test pulse circuit configured to receive the calculated amount and generate a plurality of pulses equal to the calculated amount, wherein each of the plurality of pulses is equal to a predetermined amount of energy; and a light emitting diode disposed on the front face and coupled to the test pulse circuit for receiving the plurality of pulses and generating a plurality of infrared pulses.

BRIEF DESCRIPTION OF THE DRAWINGS

The above and other aspects, features, and advantages of the present disclosure will become more apparent from the following detailed description when taken in conjunction with the following drawings in which.

DETAILED DESCRIPTION OF THE PREFERRED EMBODIMENTS

Figure 1:
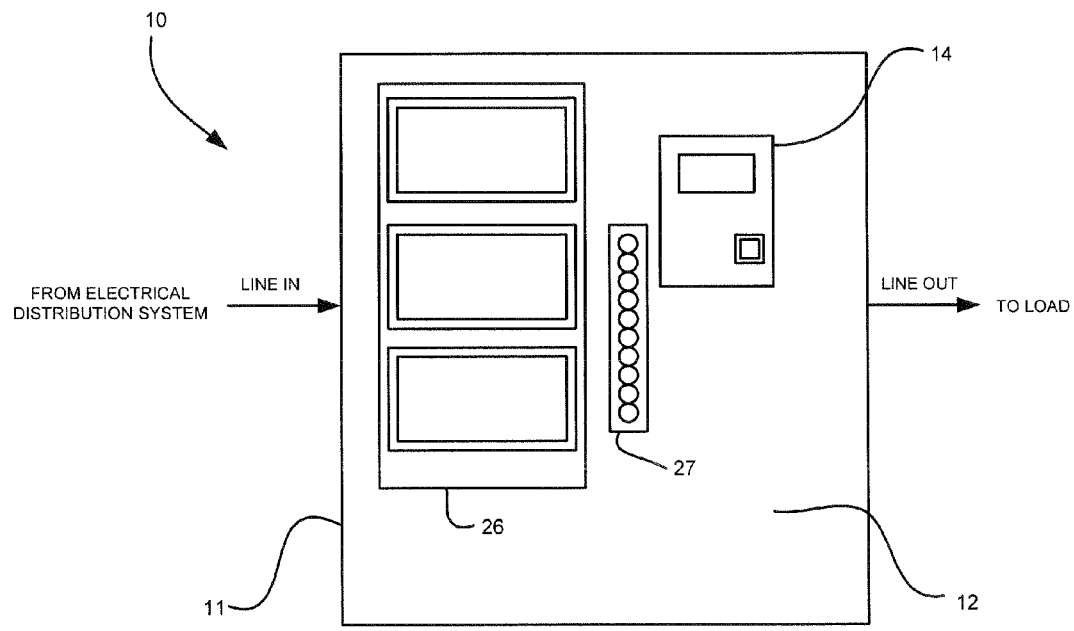
FIG. 1 illustrates a block diagram of a panel meter including an energy test pulse device according to a preferred embodiment of the present disclosure.

Preferred embodiments of the present disclosure will be described hereinbelow with reference to the accompanying drawings. In the following description, well-known functions or constructions are not described in detail to avoid obscuring the present disclosure in unnecessary detail. Throughout the figures like reference numerals represent like elements.

The present disclosure provides a device and method for assuring accuracy in verifying a panel meter, thereby enabling such panel meters to be used as power meters for the purpose of revenue metering. Verification of accuracy determines if the electronic panel meter is calibrated to within the standard traditionally used in the Utility industry for verifying veracity of electronic revenue meters, e.g., socket meters, to enable such meter to be used as utility revenue meters.

More specifically, panel meters according to the present invention are designed to provide Real Time indication, not merely energy usage indication. Panel operators are traditionally looking for the load on a bank or the voltage when employing conventional panel meters. The present invention performs this function, but also provides revenue certifiable energy data that can be brought back to a central monitoring system. Conventionally, this was a function that was relegated to "higher end" revenue metering.

The present invention provides an electronic panel meter that includes circuitry for generating an energy test pulse. FIG. 1 illustrates an electronic panel meter 10 having a front face panel 12. An energy test pulse device 14, which generates an infrared test pulse, is applied to the front face 12 of the panel meter 10. In the preferred embodiment of the present invention, the test pulse device 14 is added to the front face 12 of the electronic panel meter 10, which automatically pulses in proportion to the energy used. Sending infrared pulses in accordance with the amount of energy used is known to those skilled in the art.

Figure 1A:
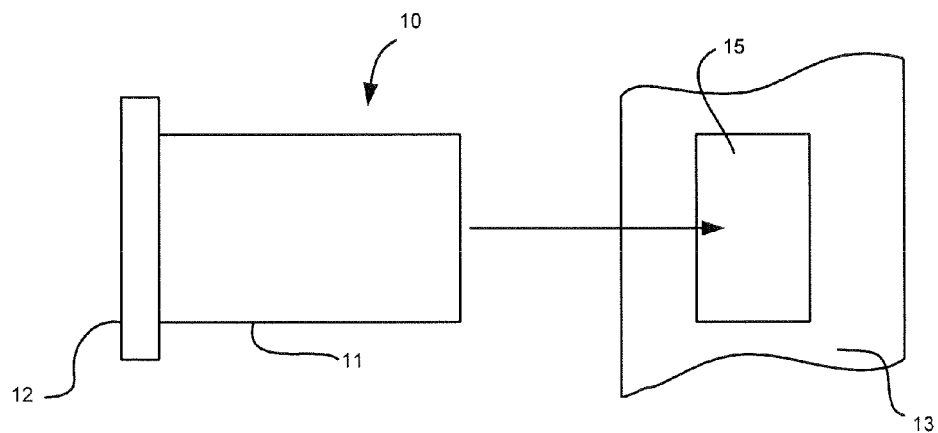
FIG. 1A is a side view of the panel meter shown in FIG. 1.

Generally, the panel meter 10 will be disposed in a housing 11 which will facilitate mounting of the panel meter 10 in a conventional indication panel 13. Referring to FIG. 1A, the housing 11 will have a generally rectangular volume that will fit in conventional DIN 92 mm square and ANSI C39.1 round cut-outs 15, as are known in the art. As can be seen form FIG. 1A. the front face 12 is dimensioned to be larger than the housing 11. In further embodiments, the housing may be configured to mount the panel meter 10 directly on a wall or on a wall using conventional DIN rail.

Figure 2:
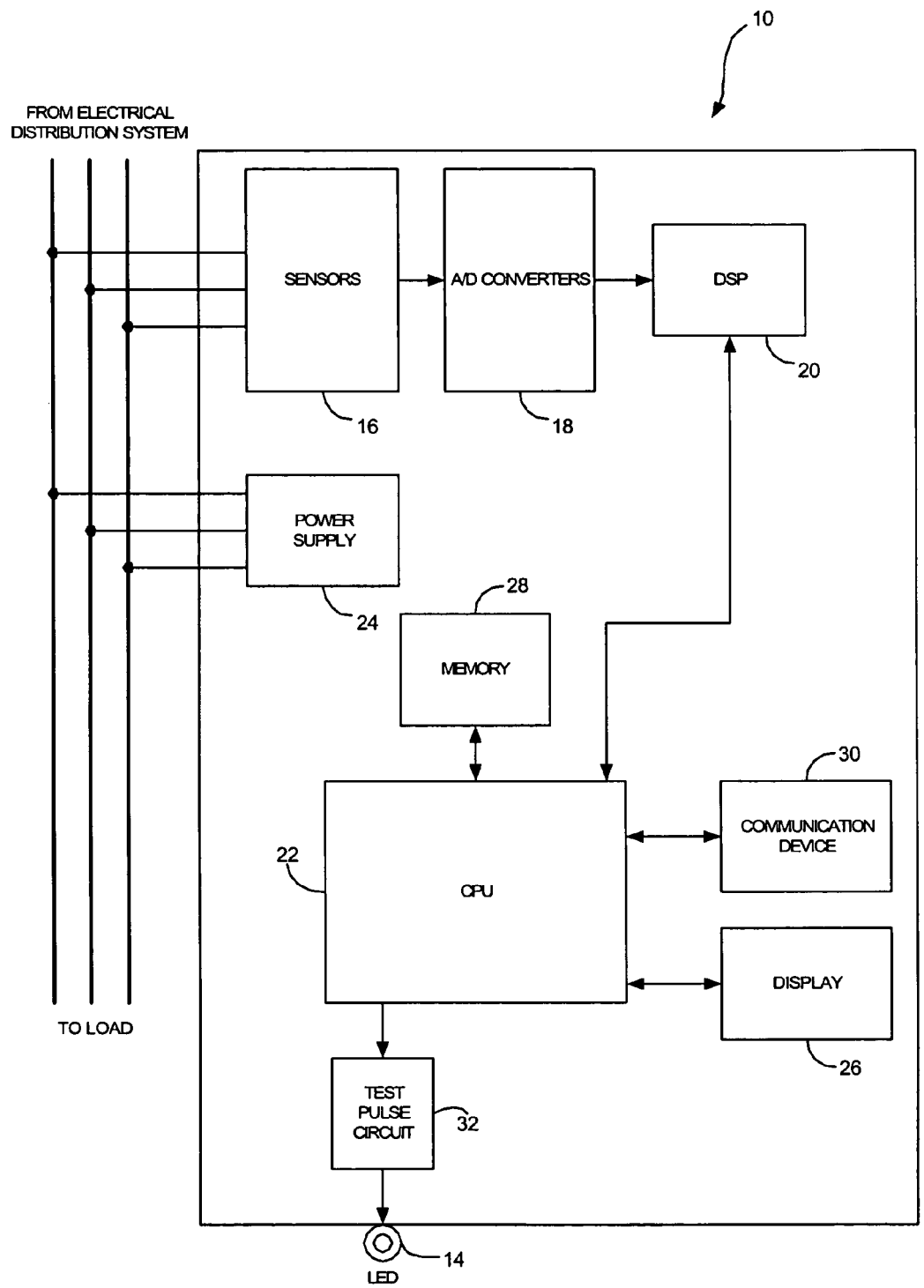
FIG. 2 is a schematic diagram of the components of the panel meter shown in FIG. 1.

The internal components of the panel meter 10 of the present disclosure for monitoring and determining an amount of electrical power usage by a consumer are illustrated in FIG. 2. Generally, the panel meter 10 includes sensors 16, a plurality of analog-to-digital (A/D) converters 18 and a processing system including a central processing unit (CPU) 22 and/or a digital signal processor (DSP) 20.

The sensors 16 will sense electrical parameters, e.g., voltage and current, of the incoming lines from an electrical power distribution system. Preferably, the sensors will include current transformers and potential transformers, wherein one current transformer and one voltage transformer will be coupled to each phase of the incoming power lines. A primary winding of each transformer will be coupled to the incoming power lines and a secondary winding of each transformer will output a voltage representative of the sensed voltage and current. The panel meter 10 will support 3 element wye, 2.5 element wye, 2 element delta and 4 wire delta systems. The output of each transformer will be coupled to the A/D converters 18 configured to convert the analog output voltage from the transformer to a digital signal that can be processed by the CPU 22 or DSP 20.

In one embodiment, the A/D converters 18 will utilize 24-bit analog to digital conversion and provide sampling at 400+ samples per cycle on all channels measured, wherein a cycle is one complete set of positive and negative values of an alternating current or voltage. Preferably, the panel meter will include six A/D converters, each individual A/D converter coupled to an individual sensor, e.g., 3 voltage sensors and 3 current sensors. By employing this high bit resolution, the panel indication meter of the present disclosure will have an accuracy of +/−0.1% for volts and amps and 0.2% for power and energy functions, which will meet the accuracy requirements of IEC687 (Class 0.2%) and ANSI C12.201 (Class 0.2%).

The CPU 22 is capable of receiving the digital signals from the A/D converters 18 to perform the necessary calculations to determine the power usage and controlling the overall operations of the panel meter 10. In a preferred embodiment, the DSP 20 will receive the digital signals from the A/D converters 18 and perform the necessary calculations to determine the power usage to free the resources of the CPU 22.

A power supply 24 is also provided for providing power to each component of the panel meter 10. Preferably, the power supply 24 is a transformer with its primary windings coupled to the incoming power distribution lines and having an appropriate number of windings to provide a nominal voltage, e.g., 5 VDC, at its secondary windings.

The panel meter 10 of the present disclosure will have user interface for interacting with a user and for communicating events, alarms and instructions to the user. The user interface will include a display 26 for providing visual indications to the user. The display 26 may include a touch screen, a liquid crystal display (LCD), a plurality of LED number segments, individual light bulbs or any combination of these. The display 26 may provide the information to the user in the form of alpha-numeric lines, computer-generated graphics, videos, etc. The user interface will also include a speaker or audible producing means (not shown) for alerting a user of alarm and for providing spoken instructions. The speaker will be coupled to the CPU 22 via a digital-to-analog converter (D/A) for converting digital audio files stored in memory 28 to analog signals playable by the speaker.

In a preferred embodiment, the display 26 of panel meter 10 will include at least three sections of LEDs, e.g., a three line display, to enable the panel meter to continuously and simultaneously display three parameters of the electrical system, e.g., voltage on each of the three phases, to a user, e.g., a panel operator. Furthermore, the display 26 will include a 10 segment LED display 27 to represent % of load on the electrical system at the point of measurement of the panel meter 10. The % of load bar display 27 may be any bar indication known in the art to quickly indicate to a user the % of load.

The panel meter 10 will include a communication device 30 for enabling communications between the panel meter 10 and other computing devices, e.g., a desktop computer, laptop computer, other intelligent electronic devices (IEDs), SCADA systems, other meters, etc. The communication device 30 may be a modem, network interface card (NIC), wireless transceiver, etc. In one embodiment, the panel meter 10 will include two communications ports: (1) a first port will provide RS485 communications speaking Modbus ASCII, Modbus RTU or DNP 3.0 protocol and (2) a second port will be an optical IrDA port coupled to the front face panel to enable setup and programming of the IED without the use of a communication cable. The first port will operate with a baud rate from about 9600 baud to about 57,600 baud. An exemplary IrDA port is disclosed in commonly owned U.S. patent application Ser. No. 10/146,339 entitled "METER WITH IRDA PORT", the contents of which are hereby incorporated by reference. The IrDA port will enable wireless transmitting and receiving of data to and from the panel meter. Preferably, the IrDA port operates according to one or more of the standard IrDA protocols, such as IrDA Infrared Link Access Protocol (IrLAP), IrDA Infrared Link Management Protocol (IrLMP), IrDA Transport Protocols (Tiny TP), IrDA Object Exchange Protocol (IrOBEX), Extensions to IrOBEX for Ir Mobile Communications, and IrTran-P (Infrared Transfer Picture) Specification. Preferably, the IrDA port transmits and receives data according to speeds defined for the IrDA version 1.0, i.e., 2400 to 115200 kbps, and speeds defined by the IrDA version 1.1, i.e., speeds of 0.576 and 1.152 Mbps, with 1/4 mark-to-space ratio. The IrDA port can also operate at a speed of 4 Mbps, i.e., 4 PPM modulation with 1/4 mark-to-space ratio. Also, the IrDA port preferably uses a pulse width of only 3/16 or 1/4 (mark-to-space ratio) of the total time for one bit. The IrDA port will enable communications to a variety of wireless handheld devices including a corresponding IrDA port such as a laptop computer, a PocketPC operating with Windows™ mobile software or Windows™ CE, a Palm OS enabled device, etc.

The panel meter 10 includes a test pulse circuit 32 for generating test pulses to be applied to the front panel face 12. The test pulse circuit 32 will drive a light emitting diode (LED) 14 for generating infrared test pulses. The CPU 22 or DSP 20 will perform the necessary calculations to determine the energy being consumed. The test pulse LED will continuously emit calibration pulses, where each pulse is equal to a predetermined number of Watthours per pulse. The predetermined number of Watthours per pulse will be user adjustable via programming from the front face panel or via a computer coupled to the communications device. Additionally, the milisecond duration of each output pulse, e.g., pulse width, is also user adjustable.

It is to be understood that the present disclosure may be implemented in various forms of hardware, software, firmware, special purpose processors, or a combination thereof. The panel meter also includes an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

Figure 3:
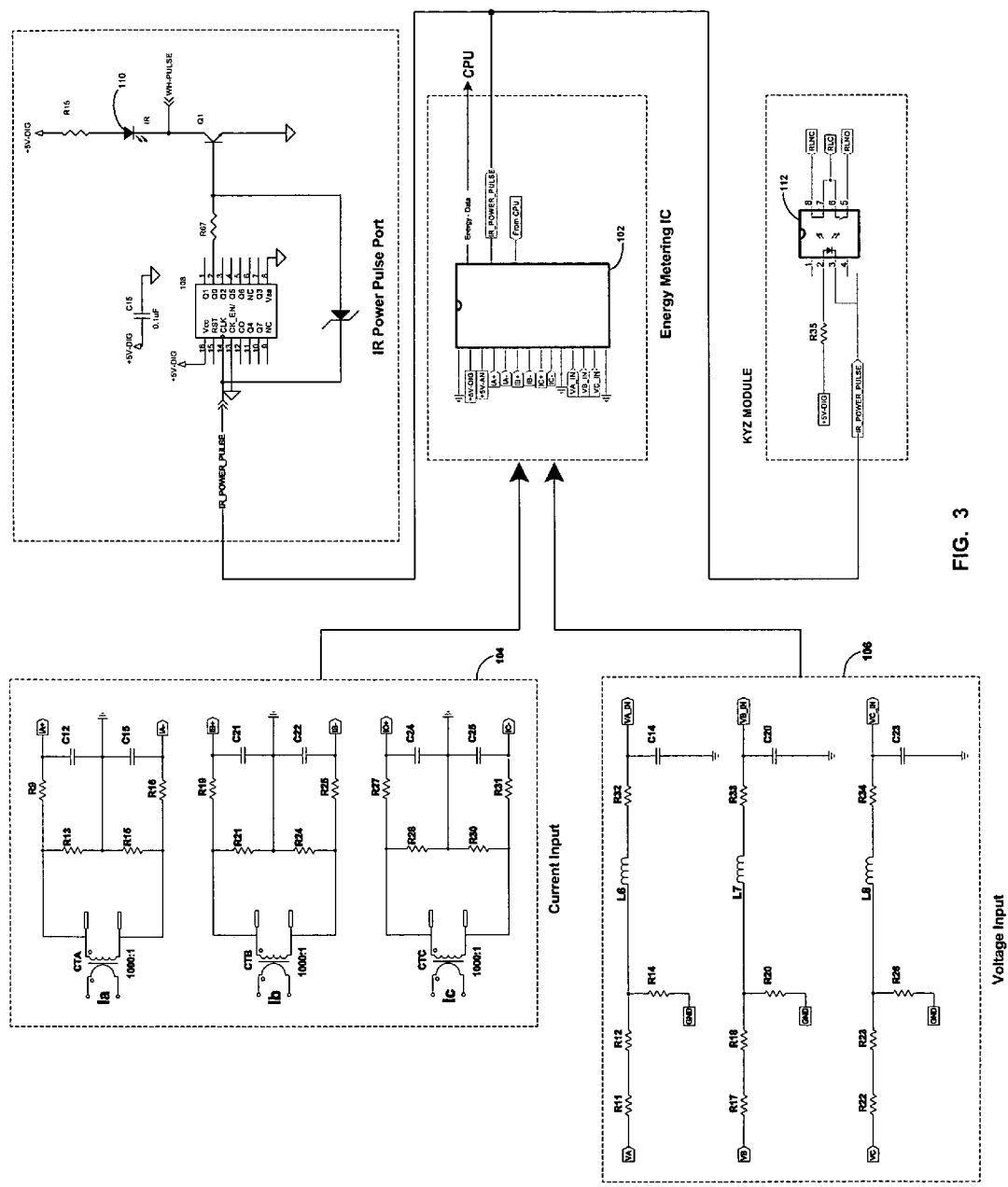
FIG. 3 is a schematic diagram of a panel meter according to another embodiment of the present disclosure.

In a further embodiment, several of the above mentioned components can be combined to conserve space in the small form factor of the panel meter of the present disclosure. In prior art revenue meters, the analog-to-digital converters, central processing unit and DSP would require at least three separate circuit boards rendering the prior art revenue meters large and expensive to manufacture making them unsuitable for panel metering which require a smaller form factor and to be inexpensive for the functionality they are providing. Referring to FIG. 3, panel meter 100 includes an energy metering integrated circuit (IC to perform the functions of ht A/D converters, central processing unit, the DSP and the test circuit. The energy metering integrated circuit (IC) is adapted to receive a current input (104) and a voltage input (106). The panel meter 100 includes three current sensors Ia, Ib, Ic and three voltage sensors Va, Vb, Vc individually coupled to a six single A/D converter channels residing on-board of the metering IC 102. The metering IC 102 will perform the necessary energy calculations via an on-board processor and will output active power information as a pulse, e.g., IR_POWER_PULSE. This pulse may be fed directly to the LED 110 to generate test pulses at the front face of the panel meter 100. However, the processing speed and frequency of the output of the metering IC 102 is too fast to be used to drive a LED test pulse to be tested by conventional testing equipment, e.g., a WECO meter tester. Therefore, the output active power information pulse, e.g., IR_POWER_PULSE, will be sent to a counter/divider 108 to, in effect, slow down the pluses. For example, if a divide-by-8 counter is employed, for every 8 pulses inputted to the counter 108, one pulse will be generated to drive LED 110. As is known in the art, the metering IC may include memory for storing operating instructions, algorithms, etc. It is to be appreciated that the analog-to-digital converters of the metering IC will have at least 24 bit resolution and the metering IC will be able to process at least 400 samples/cycles to ensure the accuracy of the panel meter for revenue standards.

The output active power information, e.g., IR_POWER_PULSE, may also be used to generate a KYZ output pulse, i.e., a three wire pulse output wherein each pulse or transition represents a predetermined increment of power. The IR_POWER_PULSE will be fed to relay 112 which in turn will generate the KYZ output pulse. An exemplary relay is model LCC110 common input OptoMOS™ relay commercially available from Clare, Inc. of Beverly, Mass.

Furthermore, the metering IC 102 includes a SPI serial interface for outputting energy data to the CPU 22. The CPU will then further process the data as needed, e.g., generating signals representative of values to be displayed on display 26, calculating % load, etc.

Figure 4:
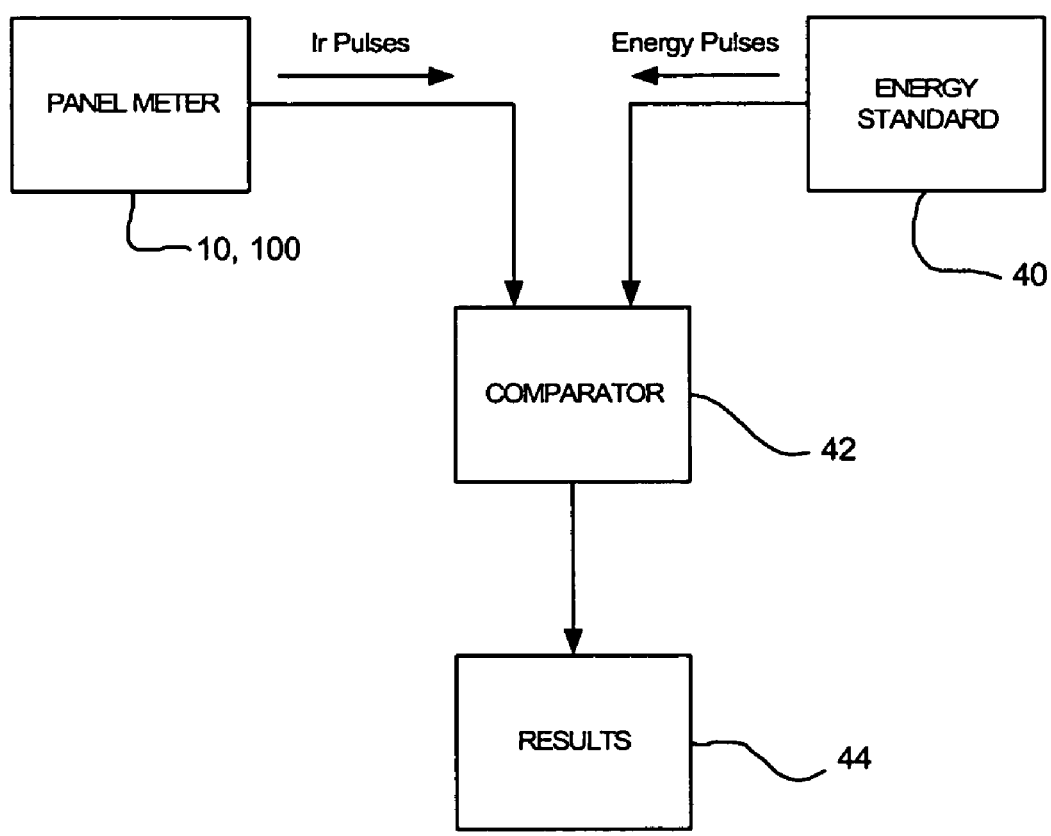
FIG. 4 is a diagram illustrating a method for testing the veracity of the panel metering device of the present disclosure.

To be certified for revenue metering, power providers and utility companies have to verify that the panel meter will perform to its stated accuracy. Referring to FIG. 4, a method for testing the veracity of the panel metering device is illustrated. The panel meter 10,100 of the present disclosure will be compared to an energy or reference standard 40. The reference standard 40 is an electrical meter that is extremely accurate and has had its accuracy certified by the National Institute of Science and Technology (NIST). A variety of reference standards are commercially available from Radian Research, Inc. of Lafayette, Ind. Reference standards are manufactured in accuracy classes of ±0.1%, ±0.05% and ±0.025%, wherein the accuracy class needed for any comparative test is a function of the accuracy class of the meter being tested. Generally, laboratory testing requirements state that where possible, the comparative reference shall be of an accuracy class 10 times better than the meter being tested.

During the test, a regulated voltage and current source are simultaneously applied to the meter under test 10 and the reference standard 40. Energy pulses from the meter under test 10 and the reference standard 40 are then fed into a comparator 42 which compares the pulses of the meter to the known reference 40 to determine the accuracy of the meter under test, e.g., a results report 44. If the meter under test is within an acceptable range, the panel meter is put in use. Otherwise, if the panel meter under test is outside an acceptable range, the panel meter is either taken out of service or recalibrated.

By providing an ability to determine the calibration veracity for accumulated energy of an electrical panel meter using standard field accepted testing methods designed for a different class of product, the present invention enables a panel meter, an significant lower cost and smaller device, to be used for revenue applications and eliminates the need for two separate meters, one for panel indication, and the other for energy and revenue applications.

While the disclosure has been shown and described with reference to certain preferred embodiments thereof, it will be understood by those skilled in the art that various changes in form and detail may be made therein without departing from the spirit and scope of the disclosure as defined by the appended claims.

What is claimed is:

1. An electrical panel metering device comprising:
    a housing including a front face panel configured to facilitate mounting of the panel metering device in a cut-out of an indication panel;
    at least one sensor configured for measuring an electrical parameter;
    at least one analog-to digital converter coupled to the at least one sensor for converting the measured electrical parameter to a digital signal;
    a display disposed on the front face panel of the housing for continuously displaying at least one electrical parameter;
    a processor configured to receive the digital signal and calculate an amount of energy consumed for revenue metering; and
    a test pulse circuit configured to receive the calculated amount and generate a plurality of pulses equal to the calculated amount, wherein each of the plurality of pulses is equal to a predetermined amount of energy accumulated, wherein the test pulse circuit includes an LED disposed on the front face panel of the housing to generate infrared pulses from the plurality of pulses for verifying the accuracy of the panel metering device with an external reference standard device.

2. The panel metering device of claim 1, wherein the at least one analog-to digital converter has 24 bit resolution.

3. The panel metering device of claim 1, wherein the at least one analog-to digital converter has a sampling rate of 400 samples per cycle.

4. The panel metering device of claim 1, wherein the test pulse circuit further comprises a divider for receiving the calculated amount from the processor, generating the plurality of pulses and transmitting the pulses to the LED wherein said divider slows said plurality of pulses' rate to accommodate testing by conventional testing equipment.

5. The panel metering device of claim 4 wherein said conventional testing equipment includes calibration equipment.

6. The panel metering device of claim 1, wherein the at least one analog-to digital converter, the processor, and the test pulse circuit are disposed on a single integrated circuit.

7. The panel metering device of claim 1, wherein the display is configured to continuously and simultaneously display at least three electrical parameters.

8. The panel metering device of claim 7, wherein the display further comprising a % load bar display.

9. An electrical panel metering device comprising:
    a housing including a front face panel configured to facilitate mounting of the panel metering device in a cut-out of an indication panel;
    at least one sensor configured for measuring an electrical parameter;
    at least one analog-to-digital converter coupled to the at least one sensor for converting the measured electrical parameter to a digital signal;
    a display disposed on the front face panel of the housing for continuously displaying at least one electrical parameter;
    a processor configured to receive the digital signal, calculate an amount of energy consumed for revenue metering and generate a plurality of pulses equal to the calculated amount;
    a test pulse circuit configured to receive the plurality of pulses and outputting the plurality of pulses at an input rate of an external conventional reference standard device; and
    a light emitting diode disposed on the front face panel of the housing and coupled to the test pulse circuit for receiving the plurality of pulses and generating a plurality of infrared pulses for verifying the accuracy of the panel metering device with the external conventional reference standard device.

10. The panel metering device of claim 9, wherein the at least one analog-to-digital converter has a sampling rate of 400 samples per cycle.

11. An electrical panel metering device comprising:
    a housing including a front face panel configured to facilitate mounting of the panel metering device in a cut-out of an indication panel;
    three current sensors configured for measuring current on each of three phases of an electrical distribution system;
    three voltage sensors configured for measuring voltage on each of three phases of an electrical distribution system;
    six analog-to-digital converters for converting the measured electrical parameters to digital signals, each analog-to-digital converter coupled to one of the three current sensors and three voltage sensors;
a display disposed on the front face panel of the housing for continuously displaying at least three electrical parameters;
a processor configured to receive the digital signals and calculate an amount of energy consumed for revenue metering;
a test pulse circuit configured to receive the calculated amount and generate a plurality of pulses equal to the calculated amount, wherein each of the plurality of pulses is equal to a predetermined amount of energy accumulated; and
a light emitting diode disposed on the front face and coupled to the test pulse circuit for receiving the plurality of pulses and generating a plurality of infrared pulses for verifying the accuracy of the panel metering device with an external reference standard device.

* * * * *